United States Patent
Lisi et al.

(12) 
(10) Patent No.: US 6,501,673 B2
(45) Date of Patent: Dec. 31, 2002

(54) CIRCUIT ARRANGEMENT FOR THE LOWERING OF THE THRESHOLD VOLTAGE OF A DIODE CONFIGURED TRANSISTOR

(75) Inventors: Carlo Lisi, Milan (IT); Lorenzo Bedarida, Vimercate (IT); Antonino Geraci, Monza (IT); Vincenzo Dima, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/881,661

(22) Filed: Jun. 13, 2001

(65) Prior Publication Data

US 2002/0008994 A1 Jan. 24, 2002

(30) Foreign Application Priority Data

Jun. 13, 2000 (IT) .......................................... MI00A1315

(51) Int. Cl.[7] .............................................. G11C 16/00
(52) U.S. Cl. ................................................. 365/135.21
(58) Field of Search ....................... 365/185.21, 185.24, 365/207; 327/53

(56) References Cited

U.S. PATENT DOCUMENTS

| 6,034,888 A | * | 3/2000 | Pasotti et al. ........... | 365/185.03 |
| 6,324,098 B1 | * | 11/2001 | Condemi et al. ......... | 365/185.21 |
| 6,327,184 B1 | * | 12/2001 | Micheloni et al. ....... | 365/185.21 |
| 6,333,885 B1 | * | 12/2001 | Bedarida et al. ........ | 365/185.21 |

* cited by examiner

*Primary Examiner*—Tan T. Nguyen
(74) *Attorney, Agent, or Firm*—Lisa K. Jorgenson; David V. Carlson; Seed IP Law Group PLLC

(57) ABSTRACT

The present invention relates a circuit arrangement for the lowering of the threshold voltage of a diode configured transistor comprising a mirror transistor, a first transistor and a second transistor, said mirror transistor and said first transistor having in common the gate electrodes in a circuit node, said second transistor being connected in a transdiode configuration and placed between the gate electrode and the drain electrode of said first transistor, and a current source being connected to the gate electrode of said first transistor and to the drain electrode of said second transistor, characterized by comprising a third transistor which is configured to receive a switching signal at its gate electrode and is connected between the drain and the gate electrode of said first transistor.

11 Claims, 3 Drawing Sheets

CIRCUIT ARRANGEMENT FOR THE LOWERING OF THE THRESHOLD VOLTAGE OF A DIODE CONFIGURED TRANSISTOR

TECHNICAL FIELD

The present invention relates to a circuit arrangement for the lowering of the threshold voltage of a diode configured transistor, particularly for a reading circuit of Flash—EEPROM memory cells having a low supply voltage.

BACKGROUND OF THE INVENTION

In the reading circuits of Flash—EEPROM memory cells, if the dynamics of the voltage available to the circuit are very limited, which is the case of low supply voltages, then circuit configurations, called source mirrors, are provided. A source mirror, in addition to the classic mirror transistor, also have a first and a second transistor. The second transistor is connected as a diode and placed between the gate electrode and the drain electrode of the first transistor. A current source, having an electrode connected to the gate electrode of the first transistor and to the drain electrode of said second transistor, is adapted to bias the diode connected transistor, as shown successively in FIG. 2.

In this way and using a productive process that allows the transistors having threshold voltages of different values, it is possible to lower the value of the threshold voltage in the first transistor, so as to realize a conductive channel with a lower voltage value between the gate and source electrode, that is with a lower $v_{gs}$.

An arrangement and a process of this type have the advantage of providing a transistor having a lower threshold voltage but inside a circuit architecture adapted for a reading operation of a Flash—EEPROM type memory cell, said operation is not made by a discharging current of the memory cell but by means of the bias source current.

This involves said bias current being much lower than the memory cell current, a delay in the settlement of all the voltages and of all the currents of the circuit architecture in examination, causing relevant repercussions on the access time during the reading operation of the stored voltage value.

Moreover, the presence of the diode bias source introduces a systematic offset that alters the value of the discharge current of the memory cell, causing a wrong interpretation of the stored logic state.

SUMMARY OF THE INVENTION

It is an object of the present invention to obtain a lowering of the threshold voltage.

According to the present invention, such object is achieved by a circuit arrangement for the lowering of the threshold voltage of a diode configured transistor comprising a mirror transistor, a first transistor and a second transistor, the mirror transistor and the first transistor having the gate electrodes in common in a circuit node. The second transistor is connected in a transdiode configuration and placed between the gate electrode and the drain electrode of said first transistor. A current source is connected to the gate electrode of the first transistor and to the drain electrode of the second transistor. A third transistor, configured to receive a switching signal at its gate electrode, is connected between the drain and the gate electrode of said first transistor.

Thanks to the present invention it is possible making a circuit arrangement for the lowering of the threshold voltage of a diode configured transistor in a reading circuit of Flash—EEPROM type memory cells so that the static characteristics, that is the discharged time of the memory cells, and the dynamic characteristics, that is the precision of the mirror factor of the circuit architecture in examination, are maintained unchanged.

BRIEF DESCRIPTION OF THE DRAWINGS

The features and the advantages of the present invention will be made evident by the following detailed description of an embodiment thereof, which is illustrated as not limiting example the annexed drawings, wherein.

DETAILED DESCRIPTION OF THE INVENTION

Figure 1:
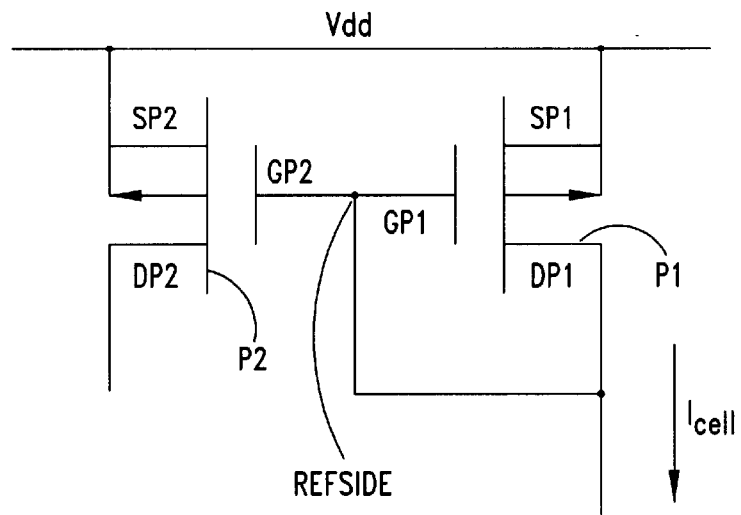
FIG. 1 shows a current mirror without a diode according to the prior art.

In FIG. 1 a current mirror without a diode according to the prior art comprising a first p channel MOS transistor P1, having its source electrode SP1 connected to a supply line Vdd and the drain and gate electrodes DP1 and GP1 short-circuited to each other, and a second p channel MOS transistor P2, having its source electrode SP2 connected to the supply line Vdd and the gate electrode GP2 connected in a circuit node REFSIDE with the electrodes GP1 and DP1 of the transistor P1, so as to realize the classic mirror configuration 1, is shown.

The transistor P2 is the mirror transistor and it has a shape ratio, that is the ratio between the width (W) and length (L) of the conductive channel, equal to the shape ratio of the transistor P1 for a multiplicative factor "m", that is $(W/L)_{P1} = m*(W/L)_{P2}$.

Generally, the reason the mirror 1 can work correctly is that it works in the saturation region that is: $v_{ds<=vgs} - v_{th}$ wherein $v_{th}$ is the threshold voltage of the transistor. Therefore higher is the value of $v_{th}$, bigger has to be the value of $v_{gs}$ in order to create the conductive channel.

This has the problem that at low supply voltage values Vdd the node REFSIDE can have a voltage value too low to enable the mirror 1, not permitting the correct bias of a memory cell (the memory cell is not shown in Figure). This problem is solved by using a diode for the lowering of the threshold voltage as shown in FIG. 2.

With the configuration described in FIG. 1, the discharge operation of the cell is made by means of a current $I_{cell}$ equal to the value of the stored voltage in the memory cell.

Figure 2:
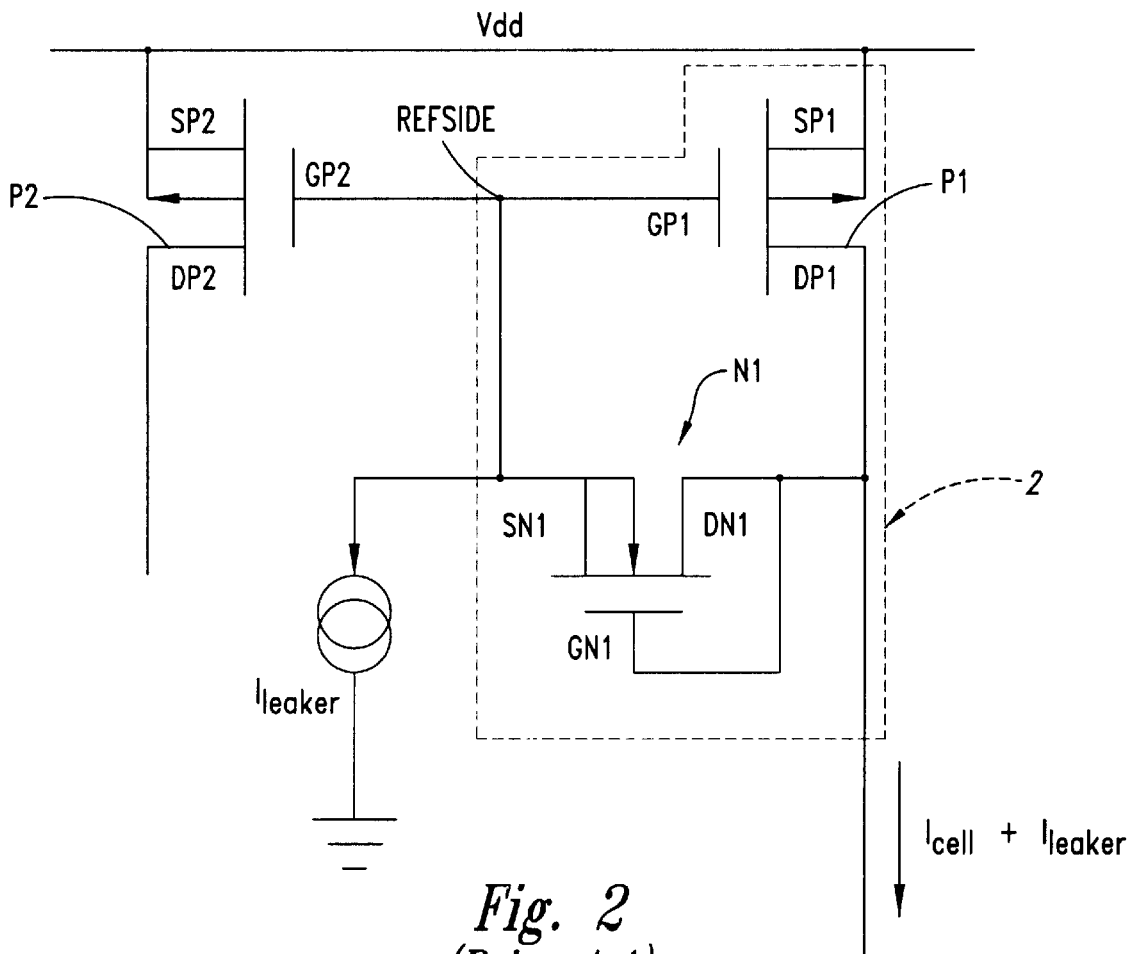
FIG. 2 shows a current mirror with a diode according to the prior art.

As shown in FIG. 2, in addition to the mirror transistor P2 and the MOS transistor P1, there is a n channel MOS transistor N1 placed in transdiode configuration having its drain electrode DN1 connected to its gate electrode GN1 and the source electrode connected to the circuit node REFSIDE.

Moreover a source $I_{leaker}$ with a low consumption is adapted to bias said transistor N1.

The role of transistor N1 is to uncouple the nodes GP1 and DP1 of the transistor P1 and thanks to a production process that allows implementing transistors having threshold voltages of different values it is possible to obtain a transistor equivalent to a diode configuration 2 with a value of the threshold voltage $v_{th}$ lower than the minimum provided by the process. In this way a conductive channel is established with a lower value of voltage $v_{gs}$.

By means of the prior art heretofore described, the discharge of a memory cell, not shown in Figure, is made by a current value provided by the bias current source $I_{leaker}$ of the transistor N1. Because the provided current by said bias source is much lower than the value of the memory cell current, that is $I_{leaker} \ll I_{cell}$, a slower settlement of all the voltages and of all the currents of the circuitry adapted to the programming and reading operations of the memory cells is obtained.

Figure 3:
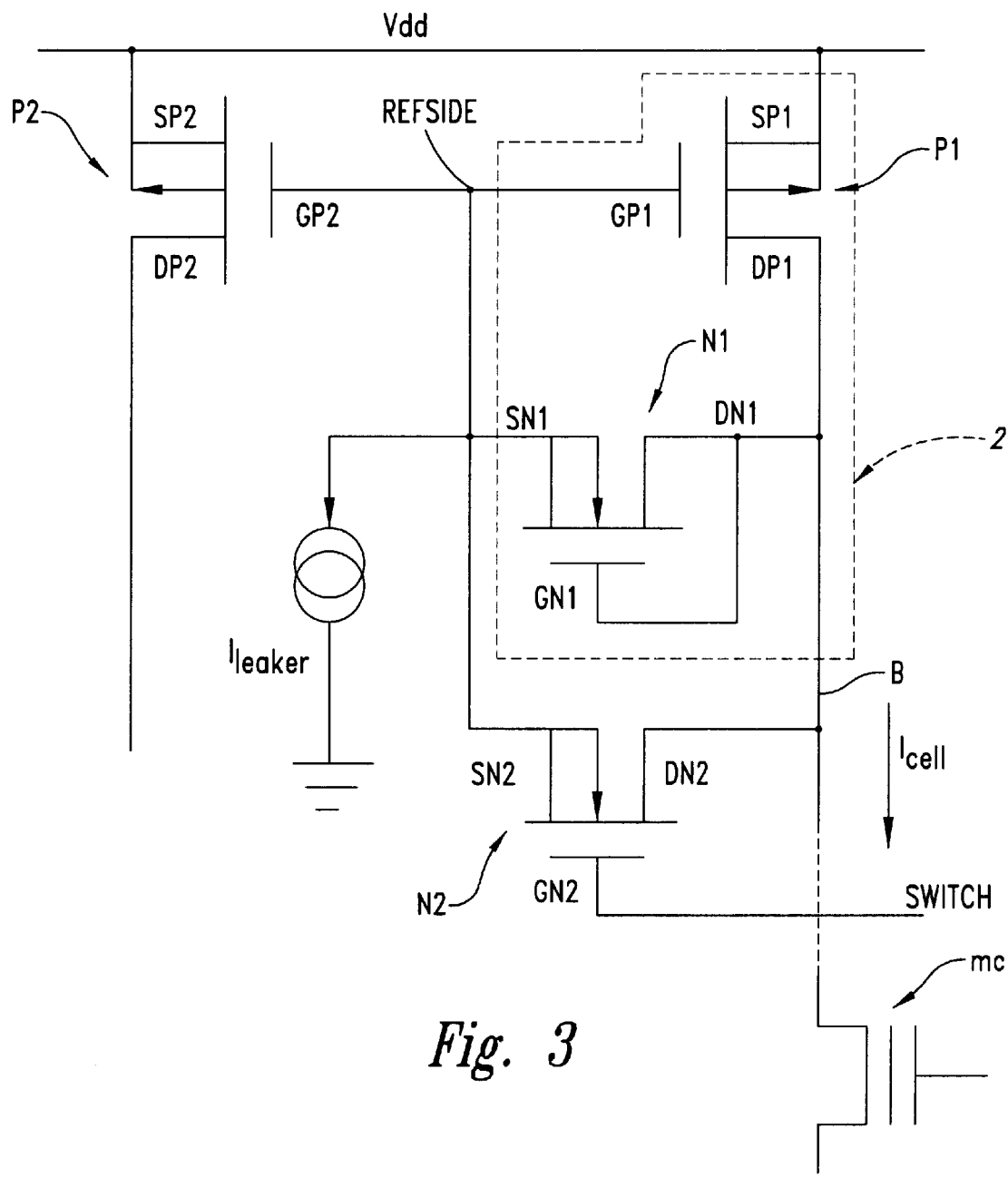
FIG. 3 shows a current mirror with a diode according to the present invention.

In FIG. 3, a current mirror with diode according to the present invention is shown, wherein is shown the introduction of n channel MOS transistor N2, having its drain electrode DN2 connected with the electrode DN1 of N1 and with the electrode DP1 of P1 and its source electrode SN2 connected with the electrode SN1 of N1 and with the electrode GP1 of P1.

The transistor N2 is controlled by means of a signal SWITCH, connected to the electrode GN2, adapted to control the turning on of said transistor N2. In one embodiment, the drain of transistor N2 is coupled to the bit line B to which a non-volatile memory cell MC is coupled. In other embodiments the line B is not the bit line, but is an extension of the bit line and numerous other switches, transistors, and enable devices are between the transistor N2 and the actual bit line B.

Said signal SWITCH is provided by means of a timing circuit that is part of the whole circuit system, the details of which are not shown in Figure.

At the moment of the turning on of the programming circuit of the memory cell the circuit node REFSIDE must have a voltage level equal to the static working voltage, that is equal to the voltage by which the equivalent configuration 2 is able to sustain the discharge current of the memory cell.

The introduction of the transistor N2 resolves an existing problem because, thanks to the signal SWITCH, that is enabled in the initial phase of the enabling of the circuit, that is in the instant of turning on of the system, said transistor N2 works in triode region for a period of time, during which the discharge of the memory cell occurs with the value of the current of the same cell and not with the value of the current of the bias source $I_{leaker}$. The time over which the transistor works in the triode mode varies over a range, for example a few nanoseconds to tens of nanoseconds.

In this way the benefit introduced by the use of the diode equivalent configuration 2 for the lowering of the threshold voltage $v_{th}$ while leaving almost unchanged the dynamic behavior of the circuit is taken advantage of.

Figure 4:
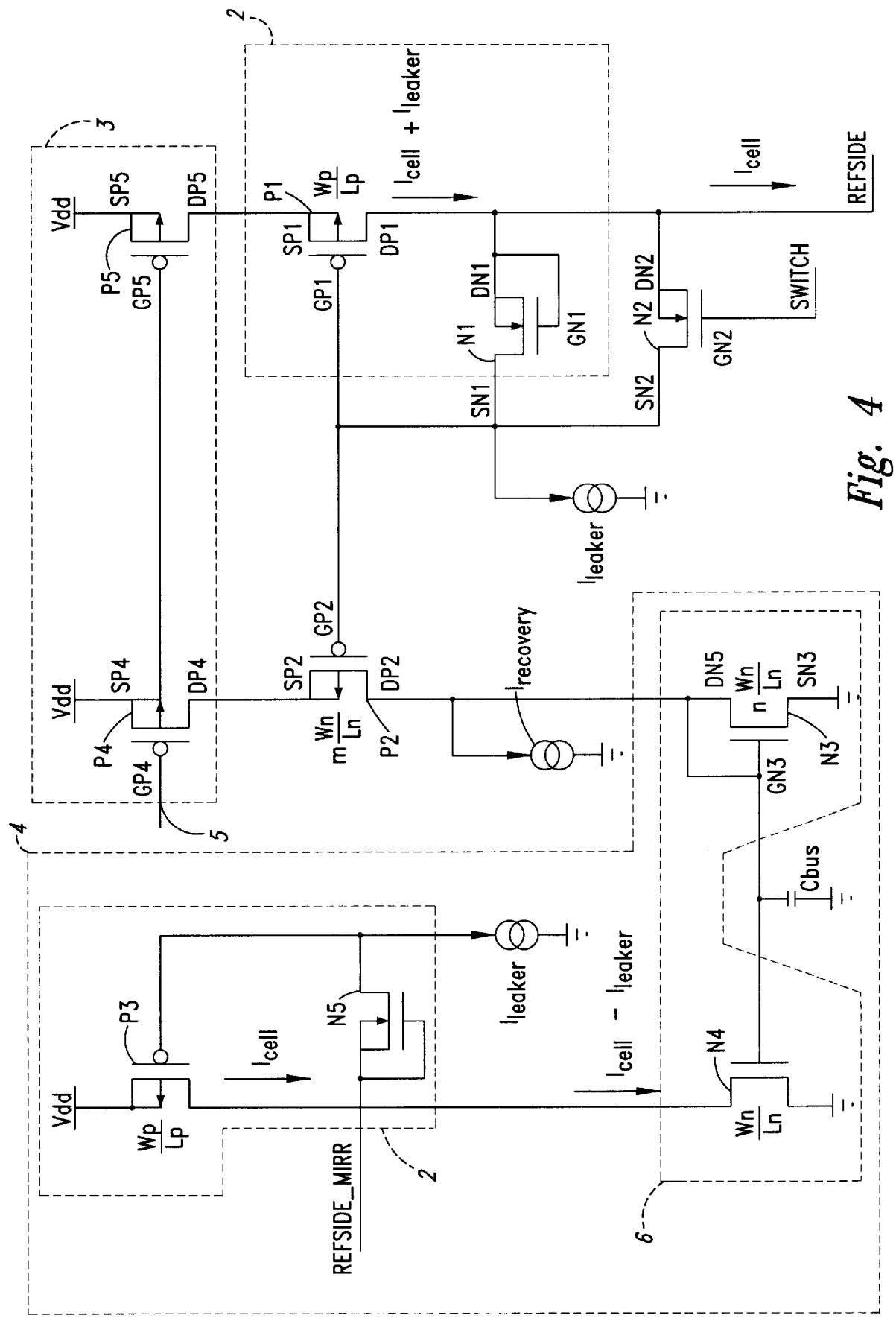
FIG. 4 shows a possible embodiment of the present invention.

In FIG. 4 a possible embodiment of the present invention is shown.

As shown in FIG. 4, further to the circuit structure described in FIG. 3 it is possible to note a first structure 3 comprising a couple of p channel MOS transistors P4, and P5. The transistor P4 is connected at its source electrode SP4 with the supply Vdd, its drain electrode DP4 connected with the electrode SP2 of P2 and its gate terminal GP4 connected with a signal 5 adapted to enable said first structure 3, while the transistor P5 has its source electrode SP5, connected with the supply Vdd, its drain electrode DP5 connected with the electrode SP1 of P1 and its gate electrode GP5 connected with the signal 5 and with the gate GP4 of P4.

A second structure 4 called a local mirror, comprising a mirror configuration 6 composed of a couple of n channel MOS transistors N4 and N3. The transistor N3 is placed in transdiode configuration, working as current comparator, having an increased shape ratio of a factor "n" with respect to the mirror transistor N4, a capacitor Cbus representing the capacity of the signal line and a further equivalent configuration 2, having a first p channel MOS transistor P3 and a second n channel MOS transistor N5, and the bias current source $I_{leaker}$, of said transistor N5.

The source $I_{leaker}$, used to bias N1, introduces a current systematic offset on the output branches of P1, with a law equal to:

$$I_{P1} = I_{cell} + I_{leaker} \tag{1}$$

This current $I_{P1}$, apart from the mirror intrinsic errors, such as output finite resistance of P2 and process and dimensional matching of P1 and P2, is mirrored on P2, according to:

$$I_{P2} = m^*(I_{cell} + I_{leaker}) \tag{2}$$

wherein "m" is the ratio between the shape factor of P2 and of P1.

The introduced offset by the source $I_{leaker}$ is propagated with the current information of the cell 3 to the input of the comparators 6. It is, therefore, necessary to recover such offset so as to not distort the content of the information.

In order to perform this objective the configuration 2 is also used in the local mirror 4 and, so doing, the current provided by P3 replays that provided by P1, that is:

$$I_{P3} = I_{N4} + I_{leaker} \tag{3}$$

The relationship (3) shows that, further to the information value $I_{N4}$, there is also the systematic error $I_{leaker}$.

In order to recover such $I_{leaker}$, so that P3 provides a current equal to the reference cell current, taking in consideration the relationship (3), the current of N4 has to be equal:

$$I_{N4} = I_{cell} - I_{leaker} \tag{4}$$

the shape factor of N3 being equal to:

$$(W/L)_{N3} = n^*(W/L)_{N4}$$

and, taking in consideration the relationship (4), the transistor current N3 has to be:

$$I_{N3} = n^* I_{N4} = n^*(I_{leaker} - I_{cell}) \tag{5}$$

The relationship (5) represents the condition to be satisfied on the transistor N3 in order that the transistor P3 is exempt from the current systematic offset error introduced by the bias sources of the transistors N1 and N5 connected as diodes.

The introduced offset value by the transistor N3, as it is possible to deduce from the equation (5), is:

$$I_{osN3} = -n^* I_{leaker}$$

The introduced offset value by the transistor P2, as it is possible to deduce from the equation (2), is:

$$I_{osP2} = m^* I_{leaker}$$

By applying the Kirchoff's law to the node DN3 of the transistor N3, and to the node DP2 of the transistor P2, for resetting this offset current contribute a source, called $I_{recovery}$, is introduced, having a value:

$$I_{recovery} = I_{osP2} - I_{osN3} = m^* I_{leaker} - (-n^* I_{leaker}) = (m+n)^* I_{leaker} \tag{6}$$

wherein "m" and "n" are respectively the multiplicative factor of the mirror composed by the transistors P1 and P2 and the demultiplicative factor of the mirror 6, factors known a priori.

Such a circuit arrangement, that is the sources $I_{leaker}$ and $I_{recovery}$ afferent to the same mirror, guarantees, therefore, the best possible matching among the current values of the two sources, because said two sources can be deduced from an unique reference current.

Moreover putting into practice the offset current recovery, introduced by $I_{leaker}$, at only a point of the circuit, ensures an equal distribution of the mirrored current information and such a choice allows also to implement the recovery in only one point of the reference circuitry.

Finally, a circuit arrangement, as described heretofore, guarantees the offset recovery, introduced by $I_{leaker}$, in every point where the reference information can be.

The current source $I_{recovery}$ is, therefore, inserted in the branch of the mirror transistor P2 and in this way, by using the transistor connected as transdiode N1, it is possible to lower the threshold voltage in the current mirror of the reference circuit. The circuit maintains the precision characteristics of the mirror factor and the duration of the turning on phase of the circuit architecture for reading of the stored voltage in the memory cell. The circuit thus has the correct dynamic characteristics, such as the turning on times, and static characteristics, including the precision of the mirror shape of the circuit architecture under examination.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit arrangement for the lowering of the threshold voltage of a diode configured transistor comprising:
    a mirror transistor;
    a first transistor and a second transistor, said mirror transistor and said first transistor having in common the gate electrodes in a circuit node, said second transistor being connected in a transdiode configuration and placed between the gate electrode and the drain electrode of said first transistor;
    a current source being connected to the gate electrode of said first transistor and to the drain electrode of said second transistor; and
    a third transistor which is configured to receive a switching signal at its gate electrode and is connected between the drain and the gate electrode of said first transistor.

2. The circuit arrangement according to the claim 1 wherein said third transistor is turned on by said switching signal for a period of time between the range of few nanoseconds and ten nanoseconds.

3. The circuit arrangement according to the claim 1 wherein said switching signal is turned on during the initial phase of the turning on of the circuit.

4. The circuit arrangement according to the claim 1, characterized in that said third transistor works in triode region.

5. The circuit arrangement according to claim 1, further comprising:
    a current source, inserted in the branch of said mirror transistor; and
    a comparison transistor, placed in a mirror configuration, so as to subtract from the drain electrode of said mirror transistor a current proportional to the value of the current introduced by the bias source.

6. The circuit arrangement according to the claim 5 wherein said current source provides a current having a value equal to the sum of the multiplicative shape ratio of said mirror transistor and of the demultiplicative shape ratio of said comparison transistor for the current value of said bias source, that is equal to $(m+n)*I_{leaker}$.

7. The circuit arrangement according to claim 1 wherein said second and third transistor are n channel transistors.

8. The circuit arrangement according to claim 1 wherein said first and second transistor are p channel transistors.

9. A circuit comprising:
    a non-volatile memory cell;
    a bit line selectively connectable to the memory cell;
    a sensing circuit; and
    a read enable circuit coupled to the non-volatile memory cell, the read circuit including a diode device coupled to the bit line, a reference current source coupled to the diode device, and a current mirror circuit that mirrors a current proportional to the current on the bit line to the sensing circuit.

10. The circuit according to claim 9 wherein the diode device is a diode connected transistor.

11. The circuit according to claim 9 wherein the current mirror circuit includes a transistor having its source coupled to the bit line and its gate controlled by a switch signal to effectively reduce the threshold voltage of the diode device.

* * * * *

UNITED STATES PATENT AND TRADEMARK OFFICE
CERTIFICATE OF CORRECTION

PATENT NO.    : 6,501,673 B2                                                Page 1 of 1
DATED         : December 31, 2002
INVENTOR(S)   : Carlo Lisi et al.

It is certified that error appears in the above-identified patent and that said Letters Patent is hereby corrected as shown below:

Drawings,
Sheet 3 of 3, Figure 4 should be corrected so that Fig. 4, appears as follows:

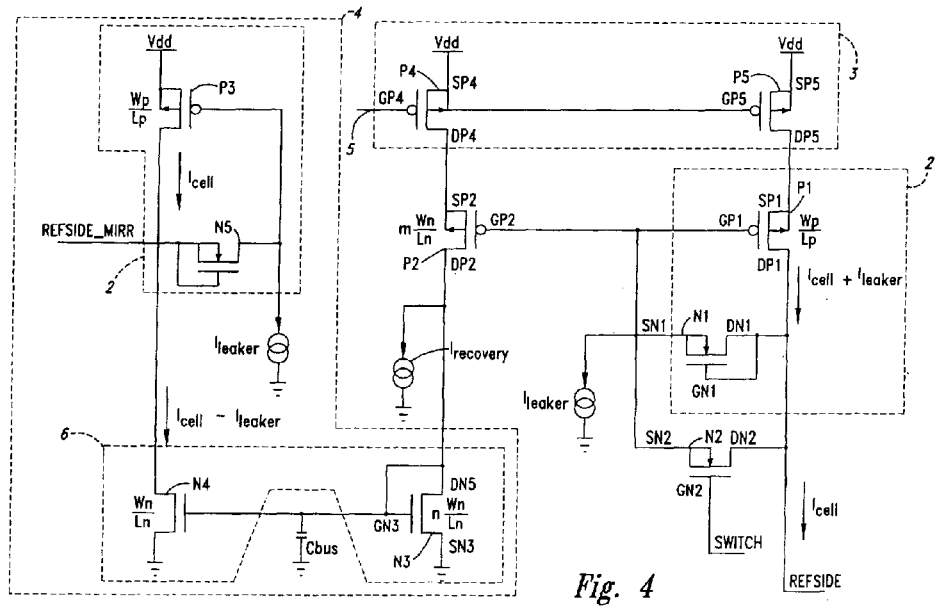

Fig. 4

Signed and Sealed this

Nineteenth Day of August, 2003

JAMES E. ROGAN
*Director of the United States Patent and Trademark Office*